United States Patent [19]
Kuisl et al.

[11] Patent Number: 6,020,217
[45] Date of Patent: Feb. 1, 2000

[54] SEMICONDUCTOR DEVICES WITH CSP PACKAGES AND METHOD FOR MAKING THEM

[75] Inventors: Max Kuisl; Karl Strohm; Manfred Røsler, all of Ulm, Germany

[73] Assignee: Daimler-Benz Aktiengesellschaft, Stuttgart, Germany

[21] Appl. No.: 09/026,693

[22] Filed: Feb. 20, 1998

[30] Foreign Application Priority Data

Feb. 21, 1997 [DE] Germany ........................... 197 06 811
Sep. 12, 1997 [DE] Germany ........................... 197 40 055

[51] Int. Cl.[7] ................................................. H01L 21/44
[52] U.S. Cl. .......................... 438/106; 438/110; 438/113
[58] Field of Search .................................. 438/106, 110, 438/113, 114, 343, 386, 485

[56] References Cited

U.S. PATENT DOCUMENTS

| 5,258,648 | 11/1993 | Lin ............................................. 257/778 |
| 5,272,600 | 12/1993 | Carey ......................................... 361/792 |
| 5,403,729 | 4/1995 | Richards et al. . |
| 5,441,898 | 8/1995 | Richards et al. . |
| 5,650,667 | 7/1997 | Liou ........................................... 257/780 |
| 5,863,812 | 1/1999 | Manteghi ................................... 438/108 |
| 5,866,948 | 2/1999 | Murakami et al. . |
| 5,879,964 | 3/1999 | Paik et al. .................................. 438/106 |
| 5,886,409 | 3/1999 | Ishino et al. ............................... 257/737 |
| 5,893,724 | 4/1999 | Chakravorty et al. ................... 438/108 |
| 5,895,230 | 4/1999 | Bartley ....................................... 438/110 |
| 5,915,169 | 6/1999 | Heo ............................................ 438/118 |
| 5,918,113 | 6/1999 | Higashi et al. ............................ 438/119 |
| 5,923,954 | 7/1999 | Cho ............................................. 438/108 |
| 5,926,696 | 7/1999 | Baxter et al. .............................. 438/118 |
| 5,933,713 | 8/1999 | Farnworth ................................. 438/106 |

FOREIGN PATENT DOCUMENTS

197 06 811  12/1997  Germany .

OTHER PUBLICATIONS

Yoshihiro Tomita et al, "Studies of High Pin Count Molded Chip Scale Package," Area Array Packaging Technologies—Workshop on Flip Chip and Ball Grid Arrays (Nov. 13–15, 1995), 1 page.

Robert T. Crowley et al, "Recent Developments in Chip–Size Packaging," Area Array Packaging Technologies—Workshop on Flip Chip and Ball Grid Arrays (Nov. 13–15, 1995), 4 pages.

Ingolf Ruge et al, "Halbleiter–Technologie" (1991), pp. 209–215.

*Primary Examiner*—John F. Niebling
*Assistant Examiner*—Walter L. Lindsay, Jr.
*Attorney, Agent, or Firm*—Venable; George H. Spencer; Allen Wood

[57] ABSTRACT

The invention relates to a semiconductor device which includes a packaged electrical component such as an IC chip, wherein terminal posts are realized within the chip area without additional wafer surface being required beyond the chip edge. A direct feedthrough of the individual electrical connections by way of downwardly extending terminal posts that are connected to bonding pads at the top of the chip results in a small lead length and thus lesser parasitic influences, which in turn results in optimum conditions for use at super-high frequencies. Furthermore, a process for making the semiconductor device offers the option of forming deep vertical trenches on the chip edge and to thus implement separation etching for dicing. During this process, the coverage of the side surface with encapsulating material effects a passivation on the chip edge without further outlay. Expensive rewiring of the connections on the bottom side of the chip is not necessarily due to the terminal posts.

26 Claims, 9 Drawing Sheets

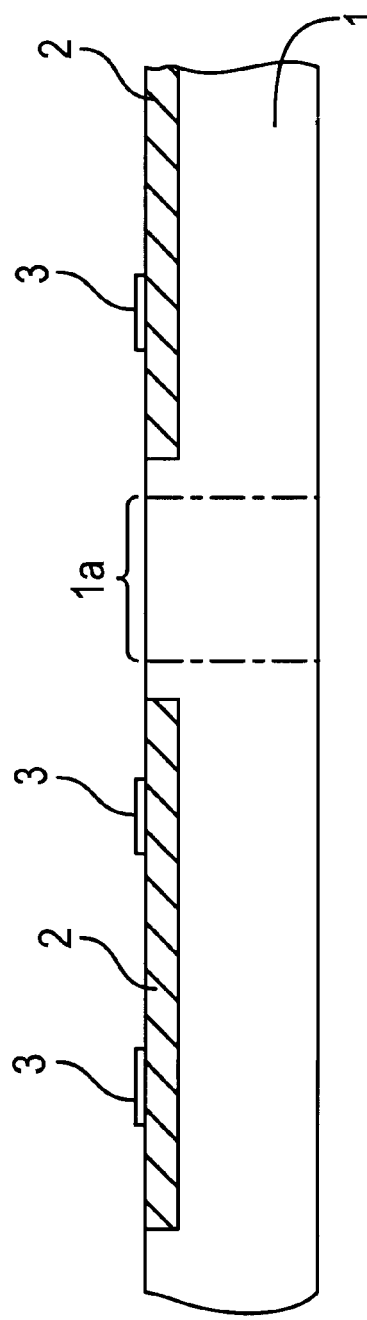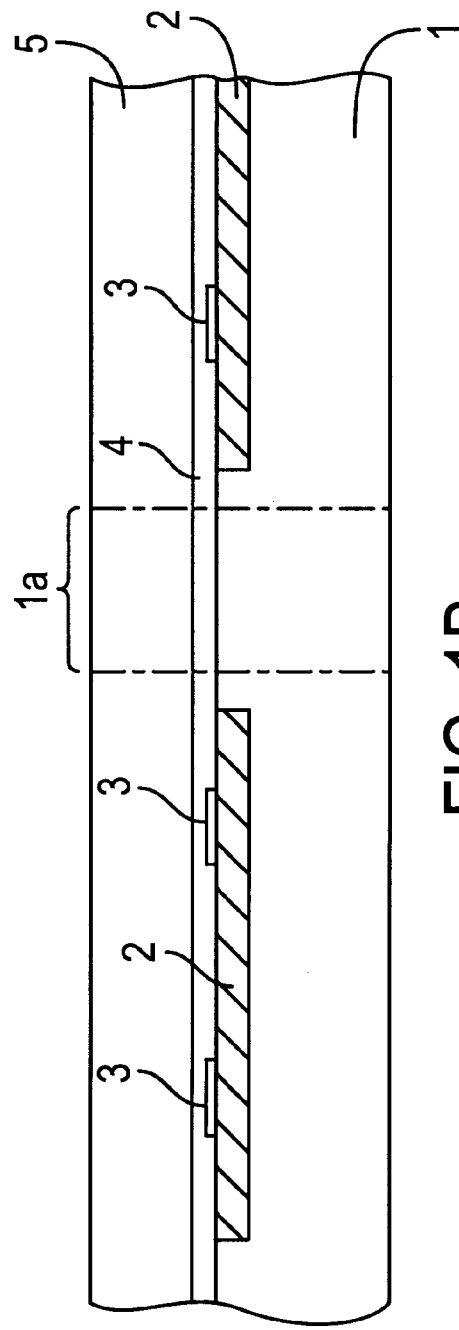

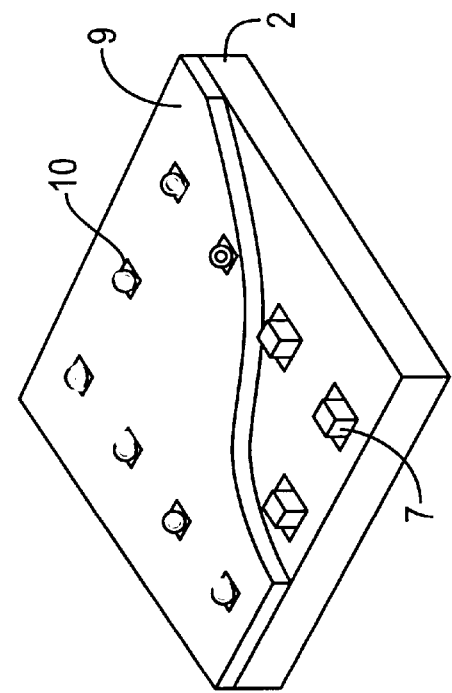
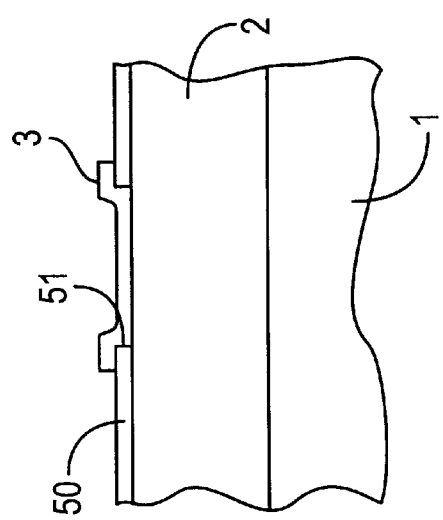
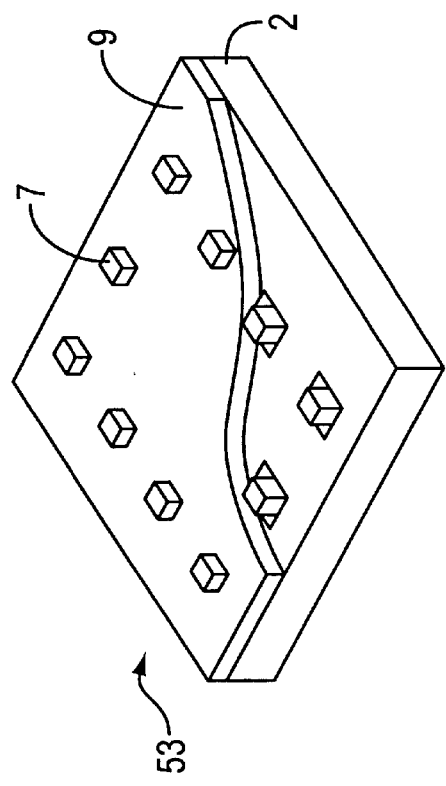
FIG. 3A
FIG. 3B
FIG. 4

SEMICONDUCTOR DEVICES WITH CSP PACKAGES AND METHOD FOR MAKING THEM

CROSS REFERENCE TO RELATED APPLICATIONS

This application claims priority of Application Ser. No. P 197 06 811, filed on Feb. 21, 1997 in Germany, and Application Ser. No. P 197 40 055, filed Sep. 12, 1997 in Germany. The subject matter of these applications is incorporated herein by reference.

BACKGROUND OF THE INVENTION

The invention relates to a semiconductor device which includes an electrical component that is packaged in such a manner that electrical connections are made via terminal posts which are comprised of substrate material and which are provided with a conductive layer. The invention also relates to a method for making the semiconductor device.

With increasing high-scale integration in information technology, the demands with respect to assembly and interconnection technology by means of designs which are volume-saving and weight-saving are becoming ever more sophisticated. In many applications, it is only through the design of complex systems comprising highly integrated electrical components with a great number of external connections that the use of electronics becomes possible. Circuit boards are still the conventional system carriers.

Several years ago, a method of packaging electrical components was developed under the name of 'chip size packaging' (referred to as CSP in the text that follows), wherein the space requirement of the packaged chip is no larger than 1.2 times the surface of the unpackaged component (Crowley et al., Workshop on Flip Chip and Ball Grid Arrays, Nov. 13–15, 1995, Berlin). An additional factor in the mounting of packaged components on circuit boards is that good connections must be ensured even for small dimensions. The method can be used for individual components, integrated circuits (IC's) as well as for high-frequency components.

A decisive factor is that a plurality of the components (in a wafer array) fabricated on a large-surface substrate can be processed by means of the process steps that are customary in semiconductor technology. This is an important prerequisite for low production costs while accomplishing high yields at the same time.

It is known that packaging according to the CSP principle is applied on the wafer level. The patents U.S. Pat. No. 5,403,729 and U.S. Pat. No. 5,441,898 describe such methods. They are comprised of a process sequence wherein an integrated circuit on the top side of a semiconductor material is covered with an insulating layer and electrical leads are placed from the IC to the substrate material by opening contact holes, with the leads having enlarged connecting areas at their ends. The substrate material residing between the connection points on the substrate and the IC is removed through trench etching. The entire surface is then covered with a further insulating layer which also fills the trench. A further etching takes place from the rear around the connection point that is predetermined on the front side, so that a terminal post is produced from the substrate material, which terminal post is electrically insulated from the remaining package and which projects slightly from the underside of the component. A metal layer on the underside of the post and on the side surface connects the front side contact electrically. The underside of the post serves as a contact surface when the electrical component is mounted on conductor tracks. Patent application AZ 197 06 811, which was not prepublished, describes a CSP fabrication method which increases the packaging density and, in the process, improves the adhesion of the terminal post to a conductor track. The 'ball grid array' technique (BGA) is also part of the state of the technology, wherein the packaged component projects only slightly beyond the original chip surface (Y. Tomita, Studies of high pin count molded chip scale package, Area Array Packaging Technologies—Workshop on Flip Chip and Ball Grid Arrays). The special feature of the BGA method lies in the two-dimensional arrangement of the electrical connections within the chip surface.

A major drawback of this method is the additional surface requirement for the scribe lines beyond which the electrical contacts are guided as well as the limitation to peripheral connections. With increasing packaging density, the terminal posts may also end up too close to the component, in which case soldering may cause a short circuit.

Further drawbacks result from the comparatively long conductor tracks, which are guided beyond the chip edge, and the ensuing parasitic effects which have a disadvantageous effect especially for high-frequency applications.

SUMMARY OF THE INVENTION

It is therefore the object of the invention to provide a semiconductor device and a method of making the same, to increase the packaging density during the packaging of electrical components, and to achieve short electrical leads and to improve the adhesion of the terminal posts to conductor tracks.

These objects can be achieved by a semiconductor device in which electrical connections are made from the bottom side of an electrical component using terminal posts which are comprised of substrate material with a conductive layer, the terminal posts being arranged in suitable but nevertheless arbitrary positions inside of, or both inside and outside of, the area occupied by the electrical component. One method of making such semiconductor devices is characterized in that the substrate and chip surface are provided with an electrically insulating overcoat layer having holes for electrical connection; bonding pads are positioned on the chip edge or at points within the chip which are intended for feedthrough of connections; the substrate and chip surface are fixedly connected by way of a cover; the substrate is thinned on the back side with the exception of a residue; terminal posts in the substrate material, insulated vis-a-vis the remaining substrate, and scribe line regions for later dicing of the chips are etched down to the bonding pads on the top side; the entire back side is covered with an encapsulating compound; and for metallization of the terminal posts, the encapsulating compound is etched off on the bottom side at the points in which the terminal posts are located and metallization is applied.

It is an essential advantage of the invention that terminal posts can be realized within the chip surface without requiring additional wafer surface beyond the chip edge. The result of the direct feedthrough of the individual electrical connections is a small lead length and thus lesser parasitic influences, which in turn results in optimum conditions for use at super-high frequencies.

It is particularly efficient that, in addition to using standard semiconductor technology processes, all process steps take place in the wafer array. Only with the aid of the technology of a high-rate etching process, which has been available for a short time, can anisotropic (i. e., vertically extending) etching profiles be accomplished with a depth in substrates such as, for example, silicon, which etching profiles also ensure the precision that is required for size reduction. Steep-sloped sides up to a depth of a few 100 μm can be produced by way of high selectivities vis-a-vis resist masks and $SiO_2$ masks. In addition, this process also offers the option of forming deep vertical trenches on the chip edge and to thus implement separation etching for dicing; during this process, the coverage of the side surface with filling material effects a passivation on the chip edge without further outlay. Expensive rewiring of the connections on the back side of the chip is no longer necessary due to skillful guidance of the conductor tracks from the terminal posts to the bond pad.

A further advantage is that, for the fabrication of silicon posts on the back side of the substrate, a method is used with which, on the planar back side of the substrate by means of a mutilayer masking, the post geometry is determined and the underside of the post is patterned as a contact surface for improved adhesion.

BRIEF DESCRIPTION OF THE DRAWINGS

FIGS. 1A and 1B are sectional views illustrating a process sequence for the top side of a wafer in a first embodiment of the invention, FIG. 3A is a sectional view illustrating an overcoat layer that is not shown in other Figures, FIG. 3B is a perspective view showing the bottom side of the completed semiconductor device of the first embodiment, and illustrates the direct feedthrough of the terminal posts, FIG. 4 is a perspective view showing the bottom side of a semiconductor device in accordance with a second embodiment, having terminal posts which are raised above the cover.

DESCRIPTION OF THE PREFERRED EMBODIMENTS

Figure 2A:
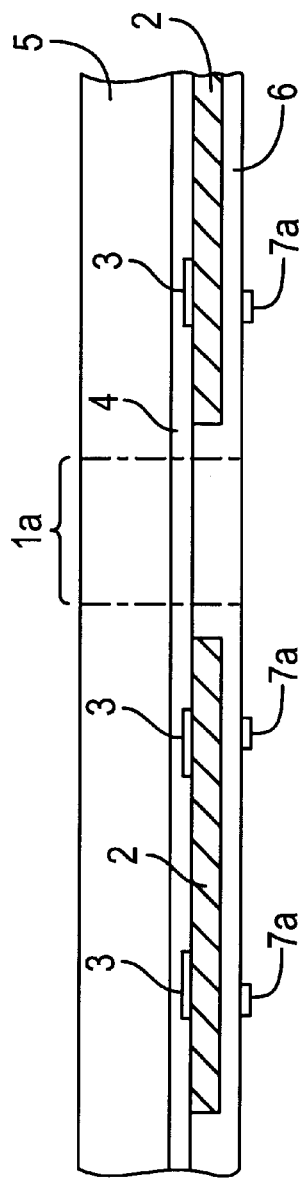
FIGS. 2A–2E are sectional views illustrating a process sequence with multilayer masking of the bottom side of the wafer for fabrication of terminal posts.

The fabrication of a semiconductor device with a CSP ('chip size packaging') package in accordance with a first embodiment of the present invention will now be described with reference to FIGS. 1A to 3B.

FIGS. 1A and 1B illustrate stages in the fabrication process on the top side of a semiconductor substrate 1 (preferably silicon) which has already been processed to provide a plurality of electrical components 2 such as integrated circuit chips. Between the components 2, a substrate region remains bare, and through this region a sawing cut 1a will later be made for dicing of the components 2. An electrically insulating overcoat layer, for example, silicon dioxide, is an integral part of the surface of the components 2; the overcoat layer is provided with holes for electrical connections. For the sake of convenient illustration, however, this is only shown in FIG. 3A (where reference number 50 identifies the overcoat layer and reference number 51 identifies one of the holes), and not in the remaining Figures. Contacts for connections on the top side are configured as metal bonding pads 3, which will subsequently be connected to metallization on terminal posts within the chip area, as will be discussed below.

The top sides of the components 2 have patterning, not illustrated. For the containment of this top-side patterning, FIG. 1B shows that the surface is provided with an encapsulating compound 4 and with a silicon cover 5, thus completely passivating the chip surface in this manner. The encapsulating compound 4 may be epoxy, for example, or an adhesive having good thermal conductivity.

FIGS. 2A–2E illustrate stages in the fabrication process on the bottom side of substrate 1. The bottom side of the substrate is thinned down mechanically or chemically over the entire surface, down to approximately 100 μm, a level which corresponds to the underside of terminal posts that are to be fabricated. This thinning-down leaves a substrate remainder 6. After this thinning-down step, the substrate remainder 6 on the bottom side is planar and thus particularly well prepared for subsequent masking. On the planar bottom side, terminal posts are fabricated by means of the following process steps and, at the same time, a scribe line region for later dicing of the components 2 is laid bare between the components. The scribe line region is configured to be slightly wider than the sawing cut 1a. The Figures only illustrate the most important intermediate results.

Figure 2B:
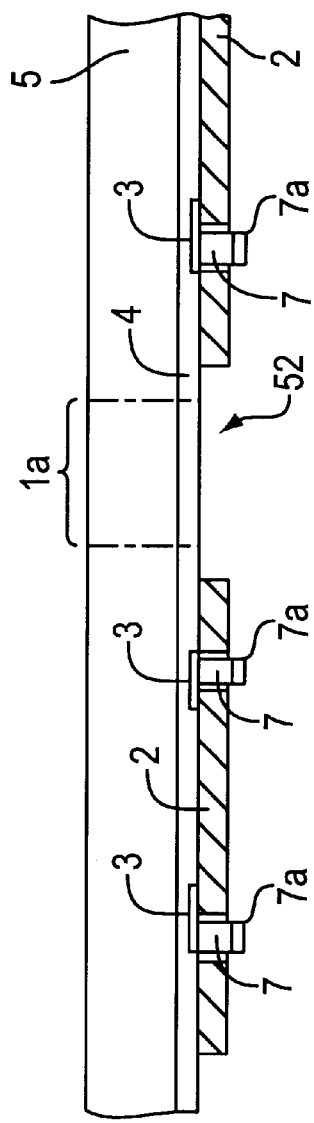
Figure 2C:
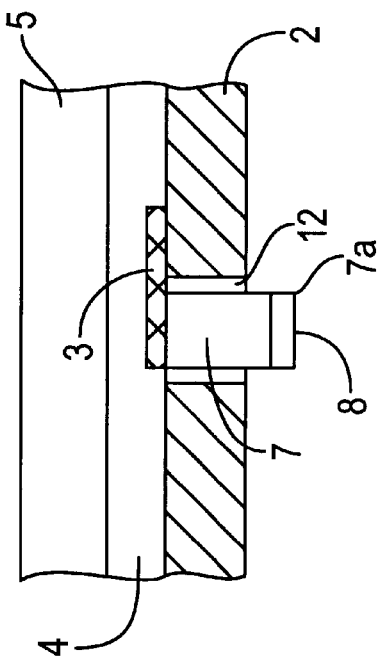

By means of a first metal mask 7a (see FIG. 2A), the positions for the terminal posts are determined on the bottom side. These positions correspond to the positions of the bonding pads 3 on the top side. With the exception of the regions of substrate remainder 6 around the metal segments of the mask 7a and between the chips (where the scribe line region is to be), the entire underside is covered by a second mask (not illustrated). Afterward, the substrate material exposed by the second mask, with the exception of a small remainder, is removed by way of a plasma etching process using an enhanced rate etcher with a high aspect ratio. After the removal of the second mask, the remaining substrate material around pillars that have formed and the remaining substrate material under the components 2 is etched off. The removal of the residue leaves terminal posts 7 and scribe line region 52 as shown in FIG. 2B. Etching is stopped during this remainder-removal step as soon as the adhesive 4 of the top side is reached in the scribe line region 52. The etching process also stops at a silicon dioxide surface or at a metal surface, i.e., also at the bonding pads 3 which are bared within the etching gaps 12 (see FIG. 2C). This is necessary so as to contact the bonding pads 3 on the top side of the components 2 from the bottom side of the components. The terminal posts 7 are slightly raised structures which are electrically separated from the remainder of the substrate, as is best shown in FIG. 2C.

By removing the substrate material within the scribe line region 52, the components 2 are separated from one another. Now, cohesion is ensured only through the bonded-on cover 5 at the top side of the array of components 2. The terminal posts 7 are metallized by total-surface sputtering on the bottom side of the array, resist patterning and electroplating reinforcement of the intended conductor track paths, and bottom etching of the total-surface metallization layer. The result is an electrical connection via a conductive layer 8 from the bonding pads 3 on the top side of the component 2 to the post surface of the bottom side. On the top side, the terminal posts 7 are now connected electrically to circuitry of the component 2 via the conductive layers 8 and the bond pads 3, and they are supported mechanically via the cover 5.

Figure 2D:
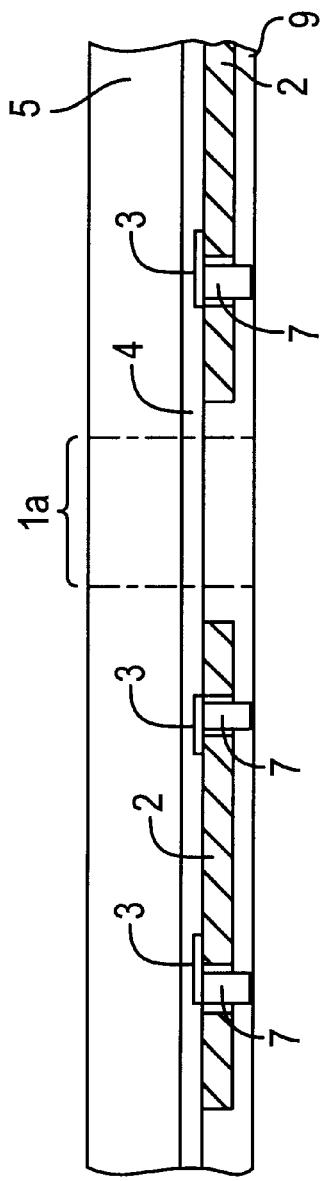
Figure 2E:
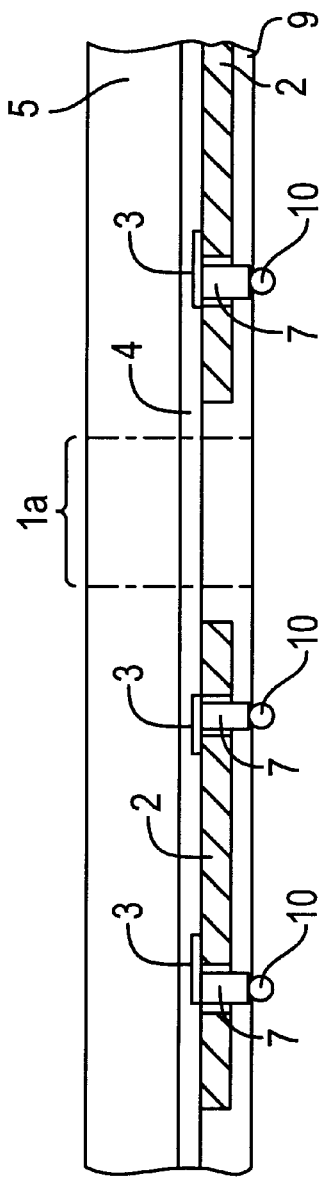

In order to give further support to the terminal posts 7, the etching gaps 12 and the scribe line region 52 are filled with encapsulating compound 9, with the bottom side of the components 2 also being covered with encapsulating compound, so that a planar surface appears again as shown in FIG. 2D. At this stage, solder material in the form of bumps or ball grids 10 can already be applied as shown in FIG. 2E by means of conventional process steps. On the planar surface, rewiring can also be accomplished with ease, if necessary.

Figure 2F:
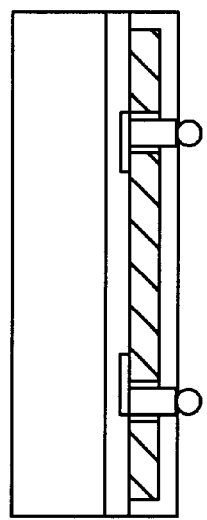
FIG. 2F is a sectional view illustrating a completed semiconductor device in accordance with the first embodiment.

All of the process steps which have been described so far are executed with the components 2 joined together. While the individual components are separated from one another when the scribe line 52 is etched, they are kept together through the cover 5 on the top side of the array. Dicing now takes place through sawing along the scribe line region 52 to separate the array into individual semiconductor devices 11 as shown in FIGS. 2F and 3B. During this process, encapsulating compound remains in place laterally along the gap separating the components 2, so that the packaged components remain protected on all sides.

In a second embodiment, the process of the first embodiment is varied so as to produce a semiconductor device 53 as shown in FIG. 4. The process sequence is supplemented by a further etching step of the on the encapsulating compound 9, which provides a bottom cover. As a result of this further etching step, the metallized terminal posts 7 project slightly from the surface. This offers the option of designing the geometry of the terminal posts 7 such that they can be adapted in an optimum manner to the subsequent process steps during bonding of the packaged components 53 to conductor tracks.

Figure 5A:
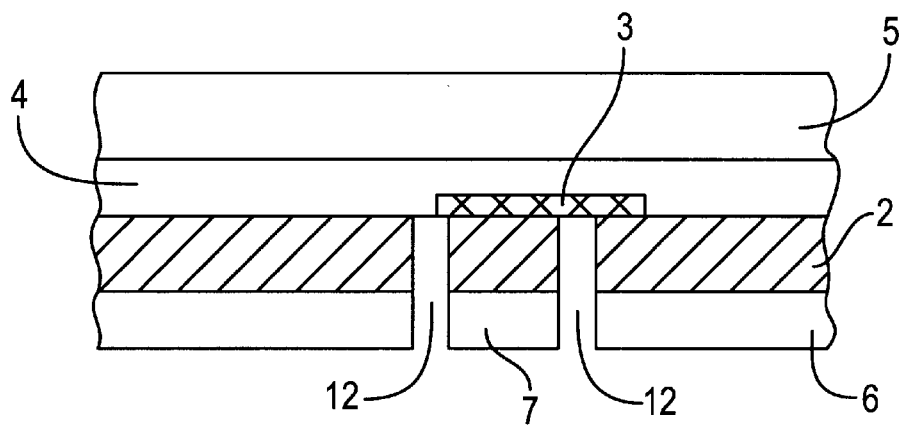
FIGS. 5A–5C are sectional views illustrating a process sequence for the fabrication of the terminal posts in accordance with a third embodiment.
Figure 5B:
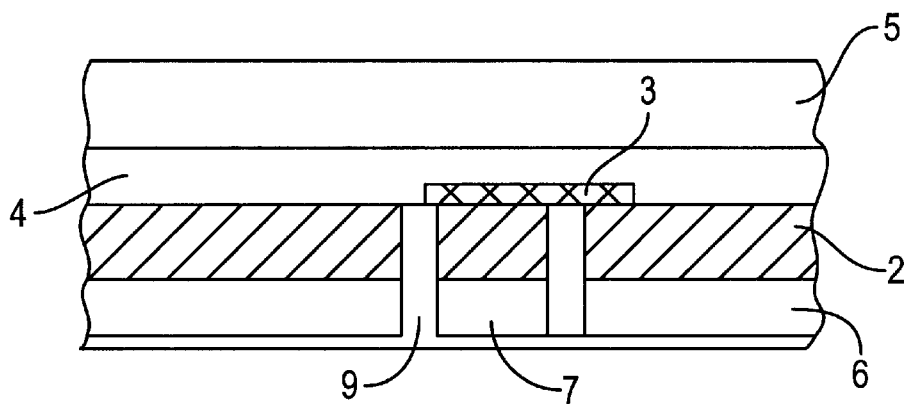
Figure 5C:
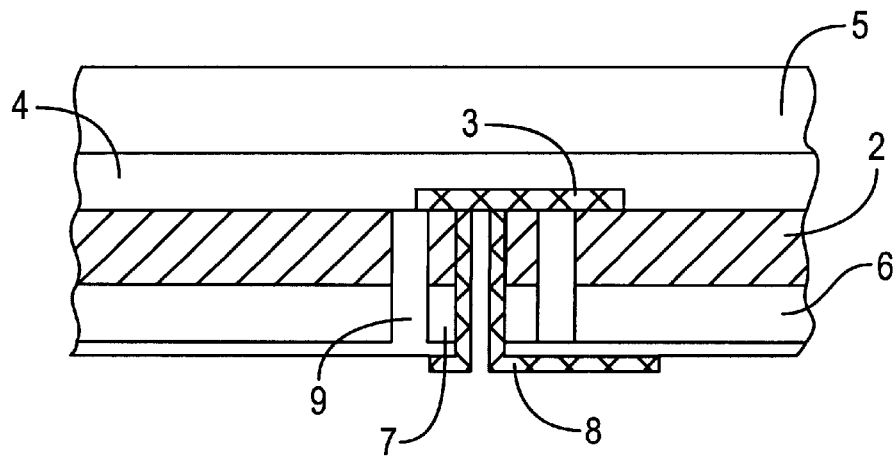

In a third embodiment, the patterning of the terminal posts 7 is varied in the manner illustrated in FIGS. 5A–5C. It is the object of this embodiment to attach the conductive layer in the center of the terminal post through two successive trench etchings, with, moreover, an insulating layer electrically insulating the bottom side of the substrate from the metallization layer. In this manner, it is also possible to rewire the connections on the back side. The variation of the process follows the step of the thinning of the bottom side of the substrate down to the substrate residue 6, as was described above with respect to the first embodiment. In FIG. 5A, a trench etching is carried out in the gap regions 12 and in the scribe line region with the assistance of a mask (not illustrated). The trenches are filled with encapsulating compound 9, with the encapsulating compound also covering the entire bottom side to provide an insulating layer. This is shown in FIG. 5B. Afterward, a further trench etching takes place in the center of the terminal posts 7, again via a mask (not illustrated), up to the top side electrical bonding pads 3. In a further process step, the trench is lined with a metal conductive layer 8, as shown in FIG. 5C. The conductive layer 8 can be used for rewiring on the bottom side of the insulating layer. The packaged components are diced in a last step, as was already explained with respect to the first embodiment.

Figure 6A:
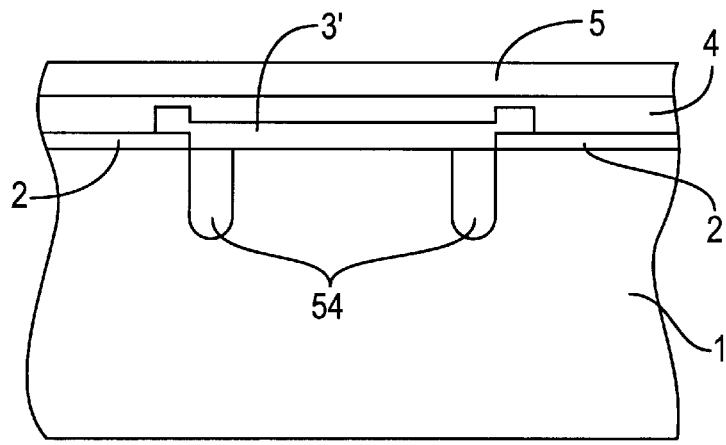
FIGS. 6A–6E are sectional views illustrating a process sequence which employs two-layered masking for the fabrication of patterned terminal posts, in accordance with a fourth embodiment.
Figure 6B:
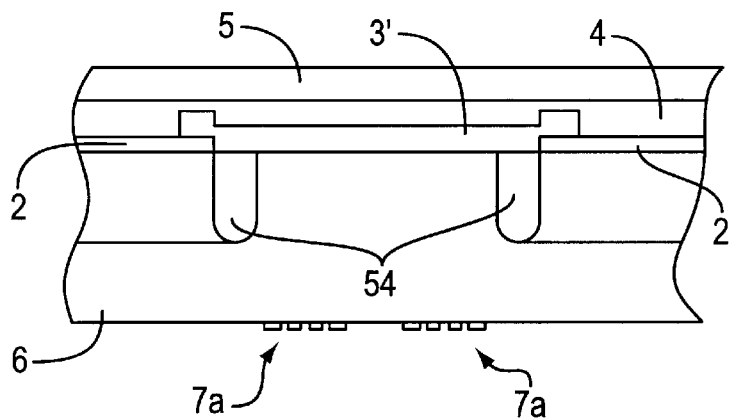

The fourth embodiment illustrates patterning of the terminal posts for improved adhesion. The processing on the top side is modified somewhat from previously described embodiments. As is shown in FIG. 6A, trenches are etched into substrate 1 beside the components 2 and these trenches are filled with an insulating encapsulating compound 54. A metal bonding member 3' (which will later be split into separate bonding pads) is deposited between the electrical components 2 and is electrically connected to circuitry (not shown) of the components 2. Again, the processing of the bottom side of the substrate 1 starts with thinning of the substrate over the entire surface down to a residue 6, as shown in FIG. 6B. After this step, the bottom side is planar and thus particularly well suited for the subsequent masking. This embodiment will be further described using an example in which the terminal posts include terminal posts that are arranged on the outside, and only the most important intermediate results will be illustrated.

Figure 6C:
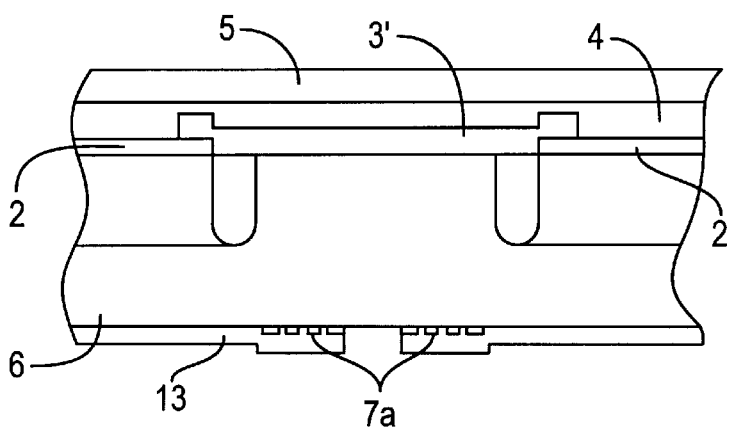
Figure 6D:
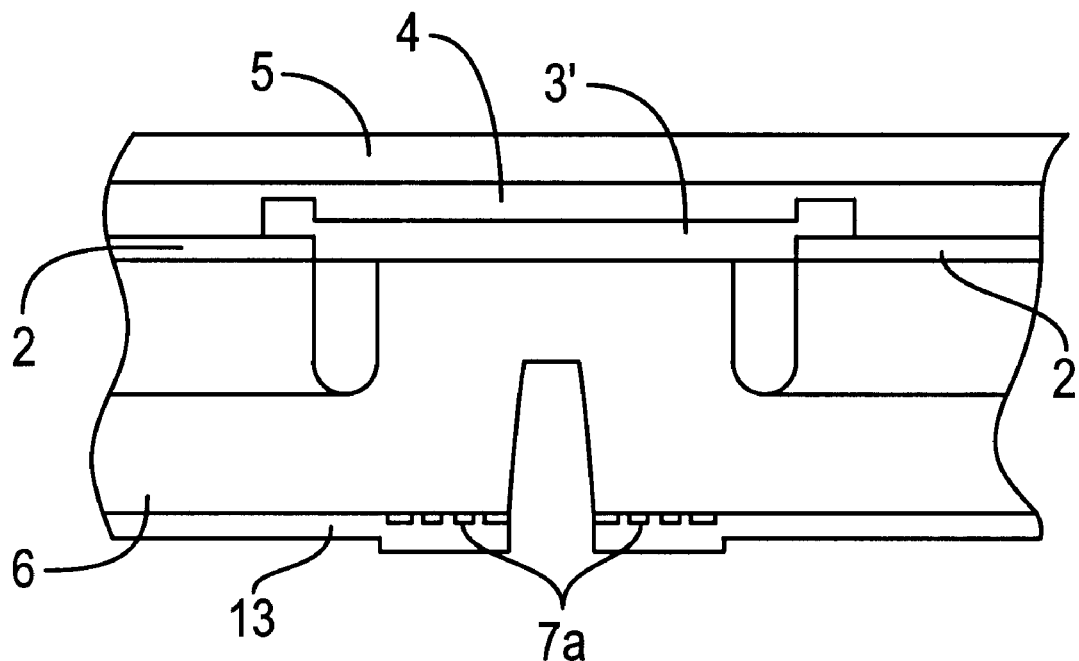
Figure 6E:
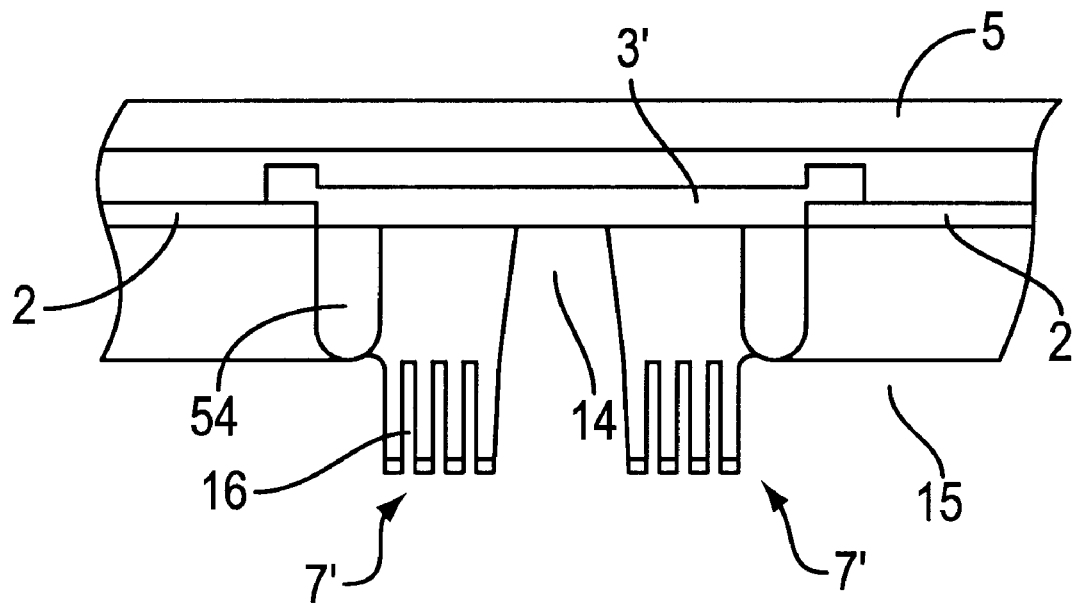

With continuing reference to FIG. 6B, the post surface is determined via a metal mask 7a at the positions selected for the terminal posts, which are predefined on the top side. Furthermore, this mask also predetermines the pattern of the underside of the terminal post which ensures a better adhesion on the circuit board. A second mask 13 (FIG. 6C) covers the entire underside with the exception of the substrate area between the adjacent posts. Afterward, some of the substrate material is removed between the terminal post locations through etching as shown in FIG. 6D. The remaining substrate material in area 14 between the terminal posts, the substrate material in area 15 under the components 2, and the material in the areas 16 provided for the patterning of the underside of the terminal posts 7 is etched away after the mask 13 is removed (FIG. 6E). This produces a slightly raised post pattern which is provided with a metallization by way of a further mask step and is thus electrically connected to the bonding member 3' of the top side. The components 2, which are now packaged, are diced by way of sawing them apart along the cutting region between the terminal posts 7'. The completed semiconductor devices can be bonded onto the conductor tracks of a circuit board by means of conventional process steps with the assistance of solder. The drawings shows that, due to the steep post slopes formed by the anisotropic etching, even a minimum distance of the terminal post from the component still ensures the required electrical insulation. Furthermore, a pinnacle pattern on the underside of the terminal post formed by the etching process offers an improved adhesion of the semiconductor device on the conductor track.

Figure 7A:
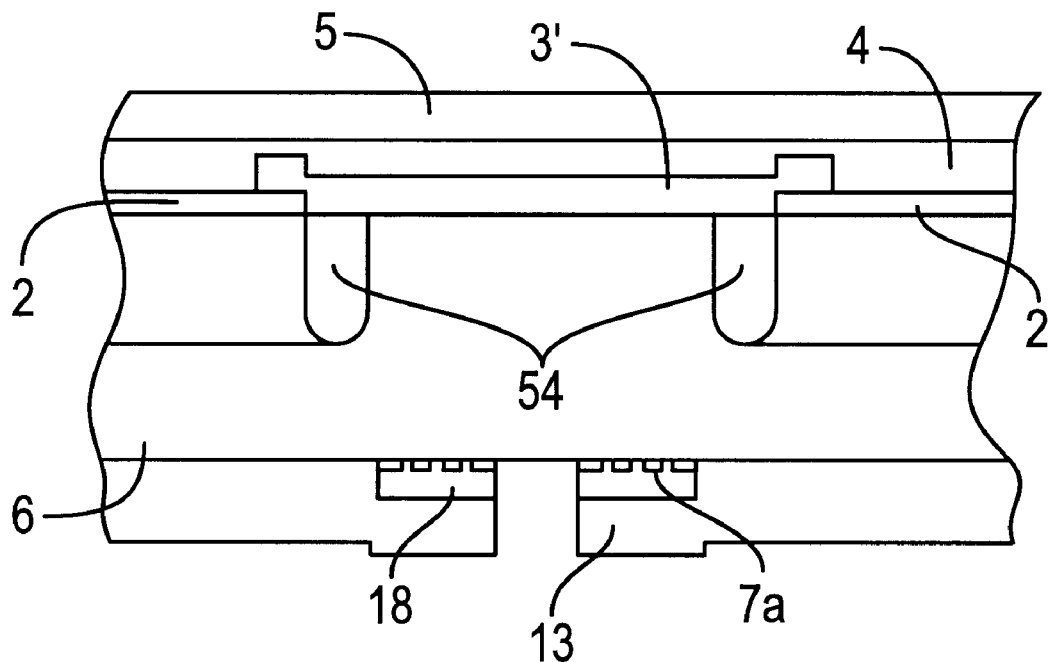
FIGS. 7A–7C are sectional views illustrating a process sequence with three-layered masking for the production of patterned terminal posts in accordance with a fifth embodiment.
Figure 7B:
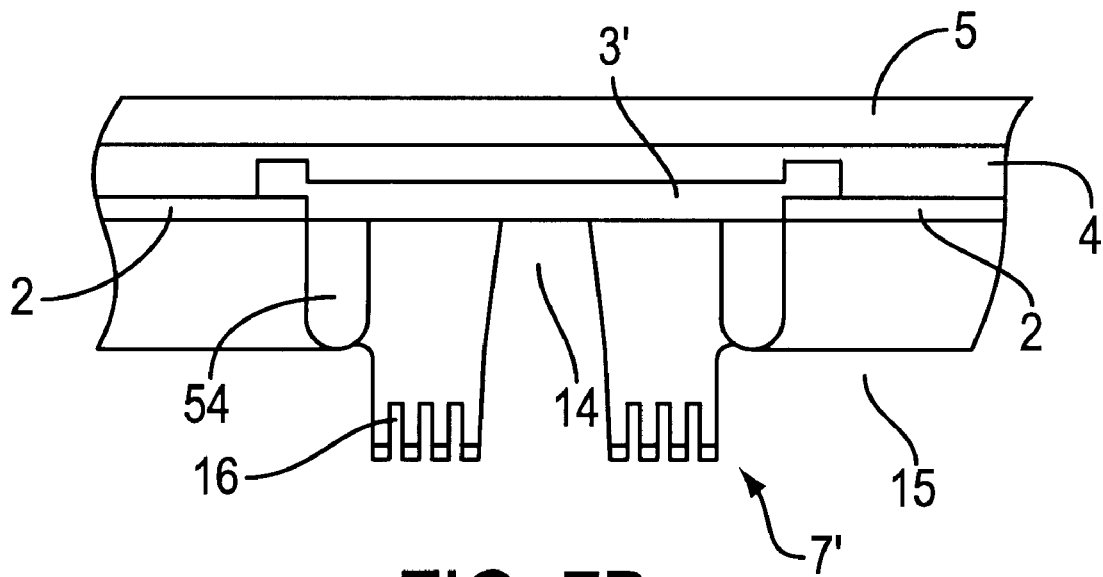
Figure 7C:
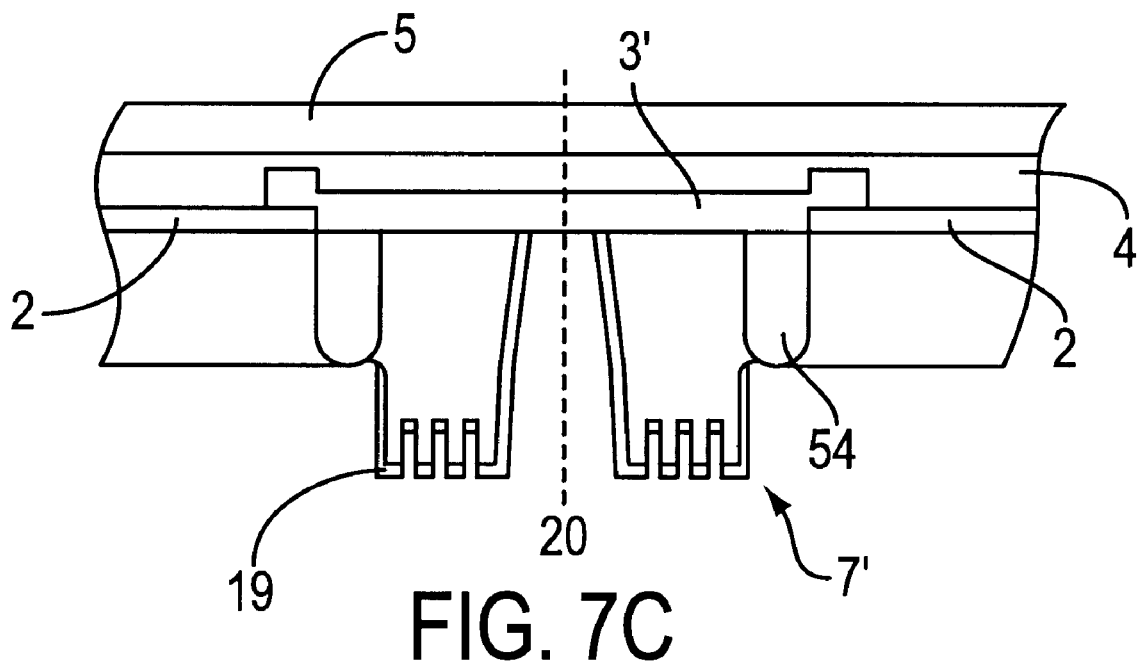

In a further embodiment, the process sequence according to the fourth embodiment is varied in the process sequence according to FIGS. 7A–7C. The process sequence is supplemented by a further mask step in which, after the application of the first metal mask 7a, the entire post surface is covered with a further metal mask 18, for example, chrome, and ultimately a resist mask 13 again forms a third mask level (FIG. 7A). In this manner, the depth of the pattern on the underside of the post can be varied in a targeted manner by way of three-stage etching process (FIG. 7B). This offers the option of designing the geometry of the underside of the terminal posts in such a manner that they can be adapted to the subsequent process steps during bonding of the semiconductor devices on conductor tracks. For the metallization of the terminal posts, for example, the flow processes of the solder at the post can be controlled in a targeted manner via the mutual wetting behavior by way of a predetermined solder material and the solder amount in conjunction with the material selection. The terminal posts 7' are again provided with a metallization 19 by way of a further mask step and are thus electrically connected to the conductor track of the front side. The now packaged components are diced through sawing them apart at the cutting region 20 between the posts (FIG. 7C).

Figure 7D:
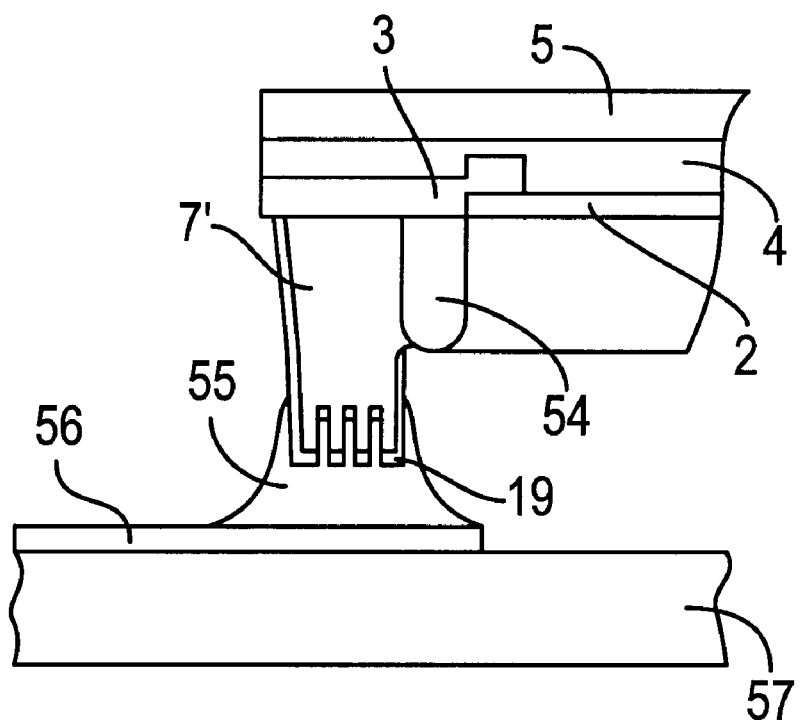
FIG. 7D is a sectional view showing a patterned post soldered to a printed circuit board.

FIG. 7D shows a semiconductor device, comprising a package component 2, electrically connected via solder 55 to a conductor track 56 on a printed circuit board.

The invention is not limited to the cited embodiments, so that other semiconductor materials, encapsulating compounds and metallizations can also be used for the production of the packages.

With a view to the disclosed packaging technology, the terminal posts can be provided at any point of a wafer for the layout of a circuit as long as no active patterns are destroyed within the chip by the separation gap. If arranged skillfully, this results in shorter conductor tracks on the chip for the circuit, with a guiding out onto the periphery no longer being necessary. Rewiring on the back side of the chip is also no longer necessary, which is customary for other CSP processes. This results in optimum conditions for use at superhigh frequencies. The size of the terminal posts is not decisive for the electrical functioning. The minimum size is determined by the etching technique that is applied. Typical terminal post dimensions are 20×20 $\mu$m and separation gaps with a width of 30 $\mu$m and a depth of 100 $\mu$m. A surface of 5×5 $\mu$m is sufficient for the use of the terminal posts as a contact surface for bumps.

It will be understood that the above description of the present invention is susceptible to various modifications, changes, and adaptions, and the same are intended to be comprehended within the meaning and range of equivalents of the appended claims.

What we claim is:

1. A method for making semiconductor devices, comprising the steps of:
   (a) fabricating an array of electrical components at a top side of a substrate, the electrical components including an insulating overcoat layer at the top side, the overcoat layer having holes for electrical connections, the electrical components additionally including bonding pads at the top side;
   (b) connecting the electrical components to a cover;
   (c) thinning a bottom side of the substrate except for a substrate residue;
   (d) etching the substrate residue in a multistage etching process to produce scribe line regions between the electrical components and to produce terminal posts which extend to the bonding pads and which have bottom ends with a predetermined pattern, the terminal posts being insulated from the remainder of the substrate material, the multistage etching process employing a plurality of masking layers and producing steep-sloped sides on the terminal posts;
   (e) metallizing the terminal posts; and
   (f) dicing the electrical components at the scribe line regions.

2. The method of claim 1, wherein the bonding pads include bonding pads that are located adjacent edges of the electrical components.

3. The methods of claim 1, wherein the bonding pads include bonding pads that are spaced apart from edges of the electrical components.

4. The method of claim 1, wherein the cover employed in step (b) is made of a material selected from the group consisting of silicon, glass, metal, and ceramic material.

5. The method of claim 1, wherein step (b) is conducted by connecting the electrical components to the cover using an adhesive.

6. The method of claim 5, wherein the cover and the adhesive have good thermal conductivity.

7. The method of claim 1, wherein the back side of the substrate is thinned mechanically during step (c) down to a residual thickness in the range of about 75 $\mu$m to about 200 $\mu$m.

8. The method of claim 1, wherein the back side of the substrate is thinned chemically during step (c) down to a residual thickness in the range of about 75 $\mu$m to about 200 $\mu$m.

9. The method of claim 1, wherein the terminal posts are patterned anisotropically during step (d) using an enhanced rate plasma etching process.

10. The method of claim 1, wherein the multistage etching process of step (d) includes a rate plasma etching process which sculpts the terminal posts and which simultaneously sculpts at least part of each of the scribe line regions.

11. The method of claim 1, wherein step (e) is conducted by sputtering and subsequent electroplating.

12. A method for making semiconductor devices, comprising the steps of:
   (a) fabricating an array of electrical components at a top side of a substrate, the electrical components including an insulating overcoat layer at the top side, the overcoat layer having holes for electrical connections, the electrical components additionally including bonding pads at the top side;
   (b) connecting the electrical components to a cover;
   (c) thinning a bottom side of the substrate except for a substrate residue;
   (d) etching the substrate residue in a multistage etching process to produce scribe line regions between the electrical components and to produce terminal posts which extend to the bonding pads and which have bottom ends with a predetermined pattern, the terminal posts being insulated from the remainder of the substrate material, the multistage etching process employing a plurality of masking layers and producing steep-sloped sides on the terminal posts;
   (e) coating the entire bottom side of the etched substrate residue with an encapsulating compound;
   (f) etching the encapsulating compound off where the terminal posts are located; and
   (g) metallizing the terminal posts.

13. The method of claim 12, wherein the bonding pads include bonding pads that are located adjacent edges of the electrical components.

14. The methods of claim 12, wherein the bonding pads include bonding pads that are spaced apart from edges of the electrical components.

15. The method of claim 12, wherein the cover employed in step (b) is made of a material selected from the group consisting of silicon, glass, metal, and ceramic material.

16. The method of claim 12, wherein step (b) is conducted by connecting the electrical components to the cover using an adhesive.

17. The method of claim 16, wherein the cover and the adhesive have good thermal conductivity.

18. The method of claim 12, wherein the back side of the substrate is thinned mechanically during step (c) down to a residual thickness in the range of about 75 $\mu$m to about 200 $\mu$m.

19. The method of claim 12, wherein the back side of the substrate is thinned chemically during step (c) down to a residual thickness in the range of about 75 $\mu$m to about 200 $\mu$m.

20. The method of claim 12, wherein the terminal posts are patterned anisotropically during step (d) using an enhanced rate plasma etching process.

21. The method of claim 12, wherein the multistage etching process of step (d) includes a rate plasma etching process which sculpts the terminal posts and which simultaneously sculpts at least part of each of the scribe line regions.

22. The method of claim 12, wherein step (e) is conducted by sputtering and subsequent electroplating.

23. The method of claim 12, wherein step (e) is conducted using an encapsulating compound selected from the group consisting of epoxy and PMMA.

24. The method of claim 12, wherein step (f) is conducted in such a manner that the terminal posts stand out after the encapsulating compound has been etched away.

25. The method of claim 12, further comprising the step of forming wiring on the encapsulating compound, the wiring being connected to at least some of the terminal posts.

26. The method of claim 12, further comprising the step of making electrical contact with at least some of the terminal posts using the ball grid array technique.

* * * * *